US010876928B2

(12) United States Patent
Aldridge

(10) Patent No.: US 10,876,928 B2
(45) Date of Patent: Dec. 29, 2020

(54) METHOD AND DEVICE TO MONITOR AND AUTOMATICALLY REPORT ELECTRIC MOTOR AND TRANSFORMER CONDITIONS

(71) Applicant: Tomm Aldridge, Olympia, WA (US)

(72) Inventor: Tomm Aldridge, Olympia, WA (US)

( * ) Notice: Subject to any disclaimer, the term of this patent is extended or adjusted under 35 U.S.C. 154(b) by 294 days.

(21) Appl. No.: 16/116,747

(22) Filed: Aug. 29, 2018

(65) Prior Publication Data

US 2019/0072460 A1 Mar. 7, 2019

Related U.S. Application Data

(60) Provisional application No. 62/554,837, filed on Sep. 6, 2017.

(51) Int. Cl.
| | | |
|---|---|---|
| *G01M 15/02* | (2006.01) | |
| *G05B 23/02* | (2006.01) | |
| *H04L 29/08* | (2006.01) | |
| *G01R 31/34* | (2020.01) | |

(52) U.S. Cl.
CPC ......... *G01M 15/02* (2013.01); *G05B 23/0213* (2013.01); *G05B 23/0283* (2013.01); *H04L 67/12* (2013.01); *G01R 31/343* (2013.01)

(58) Field of Classification Search
CPC .............. G01M 15/02; G05B 23/0213; G05B 23/0283; H04L 67/12; G01R 31/343
See application file for complete search history.

(56) References Cited

U.S. PATENT DOCUMENTS

| | | | | |
|---|---|---|---|---|
| 7,646,308 B2* | 1/2010 | Paoletti | ................ | G01R 31/343 340/635 |
| 7,797,367 B1* | 9/2010 | Gelvin | ................ | H01Q 9/0464 709/200 |
| 2011/0231169 A1* | 9/2011 | Furem | ..................... | E02F 9/267 703/2 |
| 2015/0309491 A1* | 10/2015 | Patel | .................... | G06N 99/005 700/275 |
| 2016/0071148 A1* | 3/2016 | Joshi | ................... | G06F 21/6218 705/14.5 |

FOREIGN PATENT DOCUMENTS

WO WO-2017196821 A1 * 11/2017 ............. G06N 20/00

* cited by examiner

*Primary Examiner* — Mohamed Charioui
(74) *Attorney, Agent, or Firm* — Mohr Intellectual Property Law Solutions, PC

(57) ABSTRACT

A method for monitoring and reporting conditions of motors and transformers, the steps including: first, collecting measurements and data using at least one sensor to measure performance indicators of at least one motor or transformer; next, analyzing and processing the data using local computing hardware and software connected to the at least one sensor; then, transmitting the data to a cloud based analytics system for further processing and storage of the data and analytics results; lastly, making the stored analytics results available to a user through user interface processing.

20 Claims, 4 Drawing Sheets

METHOD AND DEVICE TO MONITOR AND AUTOMATICALLY REPORT ELECTRIC MOTOR AND TRANSFORMER CONDITIONS

CROSS REFERENCE TO RELATED APPLICATIONS

This application claims priority to Provisional U.S. Application, Ser. No. 62/554,837, filed on Sep. 6, 2017, which is hereby incorporated by reference for all purposes.

BACKGROUND

The present disclosure relates generally to condition based monitoring (CBD). In particular, methods and devices to improve operations and monitoring while detecting and reporting fault for electric motors and transformers are described.

Condition based monitoring (CBD) is an important tool in maintaining the proper operation and timely maintenance of industrial equipment. Through CBD, the actual condition of the motor, machine, or transformer is monitored to decide what maintenance needs to be done, and when. When certain indicators measured through CBD begin to show signs of decreasing performance or upcoming failure, maintenance may be performed. This method and use of CBD optimizes lifespans of motors while mitigating risk of failure or downtime.

Known condition based monitoring (CBD) methods and devices are not entirely satisfactory for the range of applications in which they are employed. For example, existing CBD methods and devices use a multiplicity of largely uncoordinated measuring devices, usually as temporary debugging tools. These devices are usually only monitored, and data is collected in intervals of time. That data is then hand correlated using available tools such as Excel and Access to assemble a picture of the operation of the machine being monitored.

For example, some known CBD devices may include a power-metering device installed in a power panel that produces data stored on internal memory that can be read out only when the CBD device is accessed by an electrician and/or trained technician. Known CBD devices may further include a temperature monitoring device and/or vibration-sensing unit which may be affixed to the motor. Further, both the temperature monitoring device and vibration-sensing unit may include an internal data recorder which may require an external computer to record outputs by the devices, which are then read by the electrician or trained technician.

While these CBD devices which are monitored in intervals are satisfactory for initial commissioning and for temporary problem solving, this method of data collection, recordation, and analyzation is costly in both personnel time and equipment. Thus, there exists a need for CBD devices that improve upon and advance the design of known CBD devices.

SUMMARY

The present disclosure is directed to a method for monitoring and reporting conditions of motors and transformers. In some examples, the method includes the steps of: first, collecting measurements and data using at least one sensor to measure performance indicators of at least one motor or transformer; next, analyzing and processing the data using local computing hardware and software connected to the at least one sensor; then, transmitting the data to a cloud based analytics system for further processing and storage of the data and analytics results; lastly, making the stored analytics results available to a user through user interface processing.

In some examples of the method, at least two sensors are utilized. Additionally, the local computing hardware and software utilizes an edge intelligence device to collect and process data from the at least one sensor. Further, in some examples, the sensor is connected to the edge intelligence device through sensor interfaces defined by hardware specifications and an IO API. In some examples, two or more sensors may be used, and the two or more sensors are connected to the edge intelligence device through sensor interfaces defined by hardware specifications and an IO API.

In some examples, the method may include the step of transmitting data to the cloud based analytics system through a data gateway for additional processing. Where edge intelligence is used, at least one current transducer or voltage transducer may be interfaced to the edge intelligence device through analog signal conditioning circuits to provide an isolated and scaled analog signal to the edge intelligence device. In some methods, the sensors may be a temperature sensor or vibration sensor.

Additionally, the disclosure may relate to a CBD device for monitoring and reporting conditions of motors and transformers. The CBD device may include at least one sensor, local computing hardware and software, data gateway hardware and software, a cloud based analytics system, and a user interface processing system. This CBD device may implement the method as disclosed. For example, the device, using the at least one sensor, collects measurements and data to measure performance indicators of at least one motor or transformer. That data may be analyzed and processed using local computing hardware and software connected to the at least one sensor. The data may then be transmitted to a cloud based analytics system for further processing and storage of the data and analytics results. Lastly, the stored analytics results are made available to a user through user interface processing.

In some examples of the device, at least two sensors may be used. Additionally, the local computing hardware and software utilize an edge intelligence device to collect and process data from the sensors. The sensors may be connected to the edge intelligence device through sensor interfaces defined by hardware specifications and an IO API. Further, if two or more sensors are used, the sensors may be connected to the edge intelligence device through sensor interfaces defined by hardware specifications and an IO API.

In some examples of the device, at least one current transducer or voltage transducer is interfaced to the edge intelligence device through analog signal conditioning circuits to provide an isolated and scaled analog signal to the edge intelligence device. Further, the sensors used may include a temperature sensor or vibration sensor.

DETAILED DESCRIPTION

The disclosed condition based monitoring (CBD) methods and devices will become better understood through review of the following detailed description in conjunction with the figures. The detailed description and figures provide merely examples of the various inventions described herein. Those skilled in the art will understand that the disclosed examples may be varied, modified, and altered without departing from the scope of the inventions described herein. Many variations are contemplated for different applications and design considerations; however, for the sake of brevity, each and every contemplated variation is not individually described in the following detailed description.

Throughout the following detailed description, examples of various CBD methods and devices are provided. Related features in the examples may be identical, similar, or dissimilar in different examples. For the sake of brevity, related features will not be redundantly explained in each example. Instead, the use of related feature names will cue the reader that the feature with a related feature name may be similar to the related feature in an example explained previously. Features specific to a given example will be described in that particular example. The reader should understand that a given feature need not be the same or similar to the specific portrayal of a related feature in any given figure or example.

With reference to FIGS. 1-4, a first example of a method and device to improve operation and monitoring of motors and transformers, CBD method 100 and corresponding CBD device 200, will now be described. CBD method 100 and corresponding CBD device 200 function to measure and record power sensor data at a rate suitable for tracking and monitoring electric motors and transformer operations and automatically processing and reporting of that data. The reader will appreciate from the figures and description below that CBD method 100 and CBD device 200 address shortcomings of conventional condition based monitoring methods and devices.

For example, CBD method 100 and CBD device 200 utilize hardware and software that simplifies and improves the collection and analysis of operational data. CBD method 100 and CBD device 200 eliminate manual collection of data, quickening the monitoring of motors and transformers. Further, CBD method 100 and CBD device 200 unify data formats and provides time coherency between all data collected, allowing for more accurate monitoring and comparing of data, including creating KPI vectors. As multiple sensors may be used in CBD method 100 and CBD device 200, data collection and correlation from multiple KPIs is cheaper and easier, and also allows for easier installation on motors and transformers.

Figure 1:
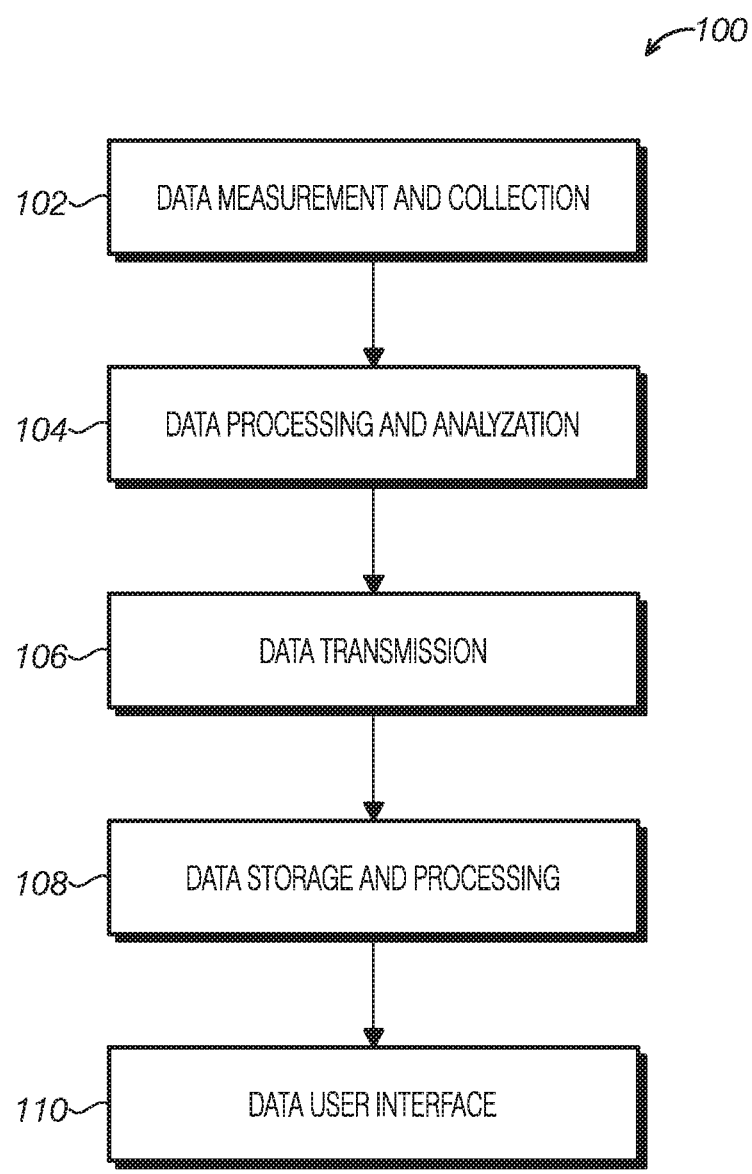
FIG. 1 is a flow chart showing a first example of a condition based monitoring (CBD) method.

As seen in FIG. 1, CBD method 100 includes the steps of first, data measurement and collection 102, where one or more sensors measure performance indicators of a motor or transformer. Next, data processing and analyzation 104 is used to translate or correlate the measured data to a usable form. After analyzation, data transmission 106 is used to transmit the data to be stored in the data storage and processing 108 stage. Lastly, the data user interfacing 110 allows a user to read and interface with the stored and analyzed data.

The step of data measurement and collection 102 of CBD method 100 may include collecting measurements and data using one or more sensors to measure performance indicators of a motor or transformer. One sensor or an array of sensors may be attached, affixed, or otherwise put on or near a motor or transformer. The sensors may include one or more sensors to detect any type of measurable performance indicator, including but not limited to ambient and motor surface temperature, tilt, motion, vibration, root mean square (RMS) current and voltage, and other key performance indicators (KPI) important to operation of a motor or transformer.

As seen in FIG. 1, after data measurement and collection 102, the data may then enter the step of data processing and analyzation 104, where the data may be time stamped, processed, and compared using local computing hardware and software. The measured data from the one or more inputs sensors from the data measurement and collection 102 step may be recorded and analyzed with an associated real time clock (RTC) generated time stamp at the sensor intake point. If necessary, software may remove latencies created between input to result by the hardware and software used to read the sensors. One example of this may be the latency between voltage and current inputs. By correcting latencies, a time coherent sensor data stream may be created and collected before analytics are computed. The RTC may be set as often as necessary through software access to a common internet timeserver. One key benefit to coherently time stamped data from multiple sensors is that all data may be aligned between the sensors nodes as it occurred. Additionally, coherently time stamped data from multiple sensors may be aligned in order, removing unknown order or inaccurate correlations of KPI data.

Further, data measurement and collection 102 may include hardware and software that measures and records power sensor data at a rate suitable for tracking of RMS current and voltage, computation of real power, and recording of peak power in real time and with cycle precision. This enables inrush power to the monitored motor or transformer to be characterized by peak power versus number of cycles or time of duration, time to peak, and shape.

The local computing hardware and software used for data measurement and collection 102 may be connected to one or more sensors using wired or wireless connections. In some embodiments of the invention, multiple local computing hardware and software devices may be used in a system, each being connected to one or more sensors through wired or wireless connection. The data may be transmitted between the sensors and the local computing hardware and software using both analog and digital signaling, or wireless connections using point to point and mesh technologies such as WiFi, LoRA and BLE.

The local computing hardware and software used for data measurement and collection 102 may specifically utilize edge intelligence or edge analytics. Edge intelligence or edge analytics is one approach to data collection and analysis which utilizes automated analytics. The local computing hardware and software utilizing edge intelligence or edge analytics may automatically perform analytical computations on the collected data at the sensors as the data is collected, instead of waiting for the data to be transmitted or sent to a remote or centralized data store. Analyzing data as it's generated and collected further reduces latencies in results and decision-making processes as concerning the motor or transformer. The sensors may be connected to the edge intelligence device through sensor interfaces defined by hardware specifications and an input/output application programming interface (IO API).

Further, the local computing hardware and software may quickly generate multi sensor KPI vectors and recognize changes, which may help to predict and prevent rapid fault and prevent failures. Sensor data may be combined into KPI vectors, each with a unique time value ($<KPI> = (t, val1, val2, \ldots, valn)$). As soon as any one value exceeds a predetermined limit, or if any resultant operator upon the KPI exceeds some predetermined limit, an interrupt may be set which may trigger an action of notification or a direct control signal from the local sensor node. KPI composition, operators, and limits may be coded into the sensor node software at the time of programming and remotely to the local computing hardware and software.

As shown in FIG. 1, after the data processing and analyzation 104, where the data is processed and analyzed locally, the data transmission 106 may occur. The data transmission 106 step may include transmitting the analyzed and collected data to a remote or centralized data store. Preferably, the data store used may be a cloud based analytics system for further processing and storage of the data. The data may be transmitted to the cloud based analytics system through a data gateway for additional processing. Similar to the local computing hardware and software, the data may be further analyzed and combined into KPI vectors, and control signals sent or transmitted to interrupt or correct operations.

Continuing in FIG. 1, after data transmission 106 to a cloud based analytics system, the stored data and analytics results may be made available to a user through data user interfacing 110 processing. The data user interfacing 110 processing allows both APIs for hardware node setup and management functions, as well as providing display and report generation for an end user of the method.

Figure 2:
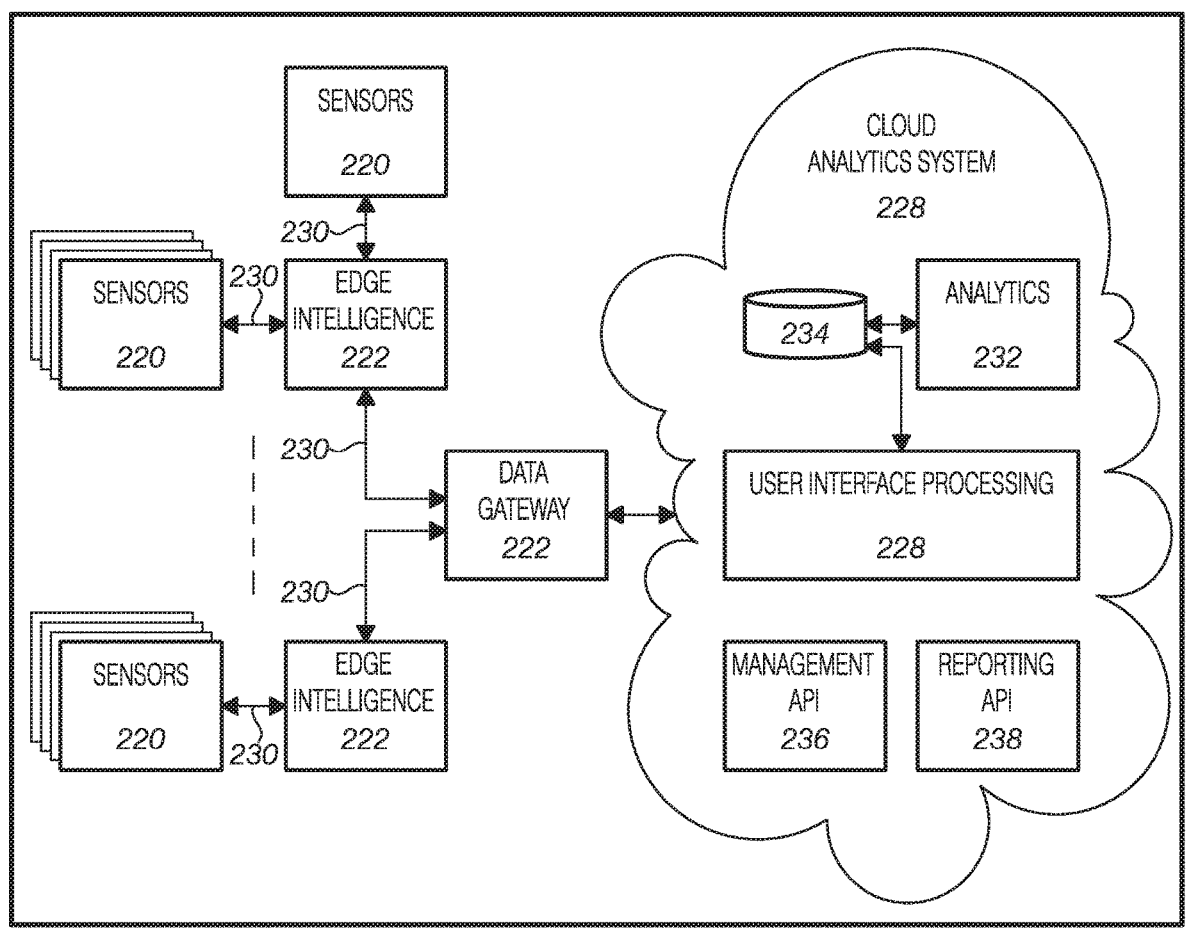
FIG. 2 is a block diagram of an example of a CBD device implementing the method shown in FIG. 1.

Turning attention now to FIG. 2, an example of a device for monitoring and reporting conditions of motors and transformers, utilizing the CBD method 100 as described above, CBD device 200, will now be described. CBD device 200 may utilize many of the steps as described in CBD method 100 to measure and record power sensor data at a rate suitable for tracking and monitoring electric motors and transformer operations and automatically processing and reporting of that data. As CBD device 200 utilizes many of the methods disclosed in CBD method 100, similar or identical features will not be redundantly explained. Rather, key distinctions and examples will be described and given for CBD device 200.

As shown in FIG. 2, CBD device 200 may include one or more sensors 220, local computing hardware and software 222, data gateway hardware and software 224, a cloud based analytics system 226, and a user interface processing system 228. The CBD device 200, using the one or more sensors 220, collects measurements and data from a motor or transformer to measure performance indicators of the motor or transformer. That data is analyzed and processed using the local computing hardware and software 222 which is connected to the sensors 220. The data is then transmitted via data gateway hardware and software 224 to a cloud based analytics system 226 for further processing and storage of the data and analytics results. The stored analytics results are then made available to a user through a user interface processing system 228.

The one or more sensors 220 may attached to a motor or transformer to monitor any variety of performance indicators. The sensors 220 may be removably or irremovably attached to the motor or transformer by any available means, including but not limited to magnets, welding, soldering, adhesive, or being integrally formed. The one or more sensors 220 after attachment, may then be integrated and linked to a single, or multiple, local computing hardware and software 222 units. The measurements read by the sensors 220 may be transmitted to the local computing hardware and software 222 by analog or digital means, and may be sent through wired or wireless connections 230.

As seen in FIG. 2, multiple sensors 220 may be integrated onto a single motor or transformer, and multiple measurements may be recorded and analyzed from the multiple sensors 220 input data simultaneously with an associated real time clock (RTC) generated time stamp. By integrating the previously separate motor key performance indicator (KPI) sensing systems into one, there may be reduced complexity and reduced equipment costs, easier installation, and ease of data processing and communications. This integration makes using multiple sensors and having multiple readings more useful to a broader market of motors and transformers.

The local computing hardware and software used for data measurement and collection may specifically utilize edge intelligence or edge analytics, as seen in FIG. 2. Edge intelligence or edge analytics is one approach to data collection and analysis which utilizes automated analytics. The local computing hardware and software utilizing edge intelligence or edge analytics may automatically perform analytical computations on the collected data at the sensors as the data is collected at the sensors 220.

As can be seen in FIG. 2, multiple sensors 220 may be attached to a single local computing hardware and software 222 or edge intelligence device, and multiple local computing hardware and software 222 or edge intelligence devices may be integrated into the CBD device 200. Each of the local computing hardware and software 222 devices may be linked to sensors 220 on a single motor or transformer or may be linked to multiple motors or transformers to collect simultaneous KPI data.

As the data from the sensors is collected, all KPI data is coherently time stamped at the sensor intake point. After the data is collected, the local computing hardware and software 222 utilizing edge intelligence or edge analytics may automatically perform analytical computations on the collected data at the sensors 220 as the data is collected, instead of waiting for the data to be transmitted or sent to a remote or centralized data store. Analyzing data as it's generated and collected further reduces latencies in results and decision-making processes as concerning the motor or transformer. The sensors 220 may be connected to the edge intelligence device through sensor interfaces defined by hardware specifications and an input/output application programming interface (IO API).

As all data is time coherent, meaning aligned with an accurate clock (NIST) and in order, including that data from multiple sensor nodes and external data sources (e.g. weather, utility pricing signals, building occupancy, etc.), making historical and real-time inferences and decisions in the cloud analytics becomes much more precise. Additionally, a multiplicity of current transducers and voltage transducers are interfaced to the local computing hardware and software 224, and through analog signal conditioning circuits, they may provide an isolated and scaled analog signal. Further, a multiplicity of temperature and vibration sensors may be interfaced to the local computing hardware and software 224 through inter-integrated circuit (I2C) interfaces, locally, and through buffers allowing for connection to externally wired smart sensors.

After the data processing and analyzation by the local computing hardware and software 222 or edge intelligence, the data may be transmitted to a remote or centralized data store. The data may be transmitted through data gateway hardware and software 224 to a remote or centralized data store for additional processing. The data gateway 224 acts as a bridge to provide quick and secure data transfer between on-site data and the remote or centralized data store.

Preferably, as exemplified in FIG. 2, the data store used may be a cloud based analytics system 226. The KPI data transferred to the cloud based analytics system 226 may be further analyzed 232 and stored 234. Similar to the local computing hardware and software 222, the data may be further analyzed and combined into KPI vectors using the cloud based analytics system 226, and control signals sent or transmitted to interrupt or correct operations.

After analytics are run on the data in the cloud based analytics system 226, results are stored 234 and available to the user through a user interface processing system 228. The user interface processing system 228 allows both management APIs 236 for hardware node setup and management functions, as well as providing display and report generation in reporting APIs 238 for the end users of the system.

Figure 3:
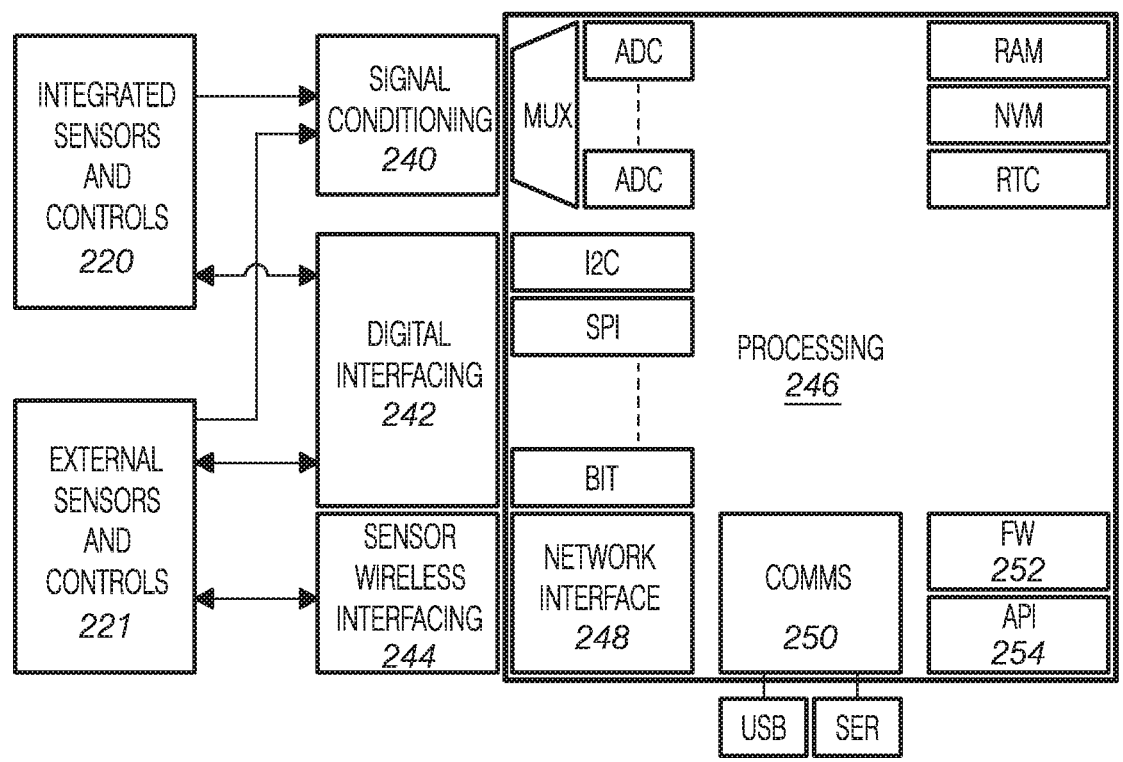
FIG. 3 is a block diagram of example hardware device used as part of the CBD device shown in FIG. 2.

Turning to FIG. 3, an example of a local computing hardware and software 222 device, or edge intelligence device, will now be briefly described. In this architecture, integrated sensors 220 and externally connected sensors 221 provide input signals of an analog or digital nature via wired or wireless interfaces 230 to appropriate intake circuits 240 242 244. In addition, controls may be connected to integrated sensors 220 or externally connected sensors 221 through wired 242 or wireless 244 interfaces. Once interfaced properly, the inputs and outputs are processed by a standard microcontroller or microprocessor 246. Processing 246 provides IO, network interface 248 and communications 250, firmware 252 and programming APIs 254 to the applications running locally, and in the cloud connected analytics. This architecture may also include unique industrial design features and power supply circuitry, including the integration of a multiplicity of individual compliant magnets on the base of the hardware unit for the purpose of affixing or attaching the hardware unit to motors, which may be cylindrical motor casings of various diameters.

Figure 4:
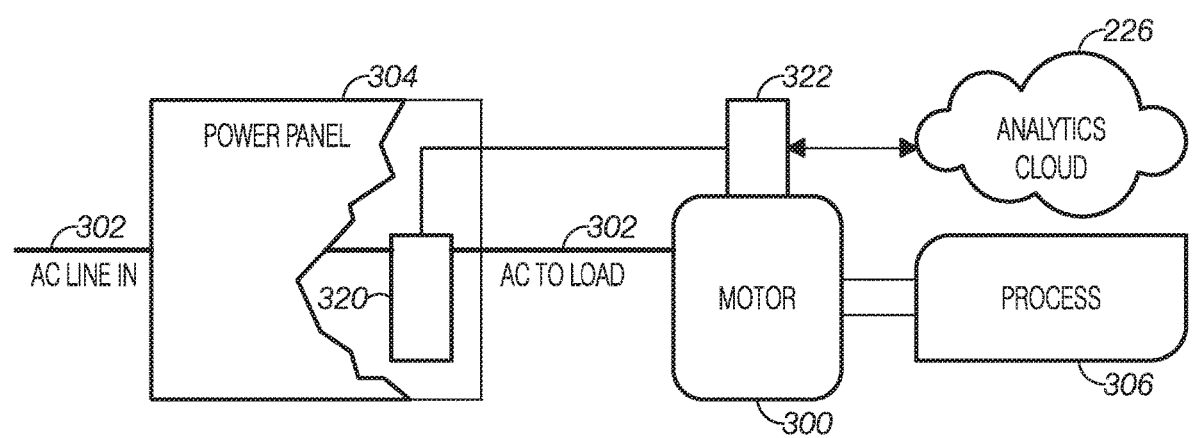
FIG. 4 is a diagram exemplifying an intended use of the CBD device shown in FIG. 2 that implements the method shown in FIG. 1.

Turning to FIG. 4, an example of use of CBD device 200 and CBD method 100 with a motor will now be briefly described. The invention, as employed in FIG. 4, is used to monitor the operation of a process motor 300 in which the motor is fed by the AC Mains 302 through a standard protection device and starter or VFD 320 in power panel 304 and drives a mechanically connected load 306. The operation of the motor 300 and connected load 306 is monitored by the CBD device 200, including the of current and voltage sensor 220 connected to sensor edge intelligence device 222. Edge processed data is transmitted, wired or wirelessly, to the analytics cloud 226 for storage and further processing before being made available through various interfaces to the user. The invention simplifies and improves the collection and analysis of operational data by eliminating manual collection of data, unifying data formats which before were disparate, providing time coherency between all data collected, and providing application specific KPIs along with high speed power sensing all in one unified application.

The disclosure above encompasses multiple distinct inventions with independent utility. While each of these inventions has been disclosed in a particular form, the specific embodiments disclosed and illustrated above are not to be considered in a limiting sense as numerous variations are possible. The subject matter of the inventions includes all novel and non-obvious combinations and subcombinations of the various elements, features, functions and/or properties disclosed above and inherent to those skilled in the art pertaining to such inventions. Where the disclosure or subsequently filed claims recite "a" element, "a first" element, or any such equivalent term, the disclosure or claims should be understood to incorporate one or more such elements, neither requiring nor excluding two or more such elements.

Applicant(s) reserves the right to submit claims directed to combinations and subcombinations of the disclosed inventions that are believed to be novel and non-obvious. Inventions embodied in other combinations and subcombinations of features, functions, elements and/or properties may be claimed through amendment of those claims or presentation of new claims in the present application or in a related application. Such amended or new claims, whether they are directed to the same invention or a different invention and whether they are different, broader, narrower or equal in scope to the original claims, are to be considered within the subject matter of the inventions described herein.

The invention claimed is:

1. A method for monitoring and reporting conditions of motors and transformers, the method comprising the steps of:
   collecting a first measurement using a first sensor affixed to a motor to measure one of a surface temperature of the motor, a tilt of the motor, a motion of the motor, a vibration of the motor, and a root mean square of a current or a voltage of the motor;
   collecting a second measurement using a second sensor affixed to the motor to measure one of the surface temperature of the motor, the tilt of the motor, the motion of the motor, the vibration of the motor, and the root mean square of the current or the voltage of the motor; wherein the second measurement is different from the first measurement;
   aligning the first measurement and the second measurement in time and order at an edge intelligence device using local computing hardware and software,
      wherein the aligning is based on a time stamp added to the first measurement and the second measurement by a real time clock;
      wherein the edge intelligence device is connected to the first sensor and the second sensor, and
      wherein the edge intelligence device is local to the motor;
   determining, at the edge intelligence device, a key performance indicator (KPI) vector, wherein the KPI vector corresponds to a function of the combined first measurement and the second measurement at a unique time value;
   transmitting the KPI vector from the edge intelligence device to a cloud based analytics system for storage of the KPI vector;
   making the stored KPI vector available to a user through user interface that is communicatively coupled to the cloud based analytics system.

2. The method of claim 1, wherein determining the KPI vector at the edge intelligence device comprises:
   determining a <KPI>=(t, val1, val2) at the edge intelligence device at
   wherein t is the unique time value,
   wherein val1 is the first measurement, and
   wherein val2 is the second measurement.

3. The method of claim 2, wherein the first sensor and the second sensor are members of a plurality of sensors, and wherein determining the <KPI> at the edge intelligence device further comprises:
   determining the <KPI>=(t, val1, val2, . . . , valn) at the edge intelligence device,
   wherein valn is a last measurement from a last one of the plurality of sensors.

4. The method of claim 3, wherein each of the plurality of sensors are affixed to the motor.

5. The method of claim 3, wherein at least one of the plurality of sensors are affixed to a standard protection device.

6. The method of claim 3, wherein at least one of the plurality of sensors are affixed to a device residing in a power panel that drives a mechanically connected load that includes the motor.

7. The method of claim 1, wherein the first sensor and the second sensor are connected to the edge intelligence device through sensor interfaces defined by hardware specifications and an IO API.

8. The method of claim 1, further comprising the step of;
transmitting the KPI vector to the cloud based analytics system through a data gateway for additional processing.

9. The method of claim 1, wherein at least one of a current transducer or a voltage transducer is interfaced to the edge intelligence device through analog signal conditioning circuits to provide an isolated and scaled analog signal to the edge intelligence device.

10. The method of claim 1, wherein the first sensor is a temperature sensor or a vibration sensor.

11. The method of claim 1, wherein the KPI vector is a first KPI vector, wherein the time stamp is a first time stamp, and wherein after the first KPI vector has been determined, the method further comprises:
collecting a third measurement using the first sensor affixed to the motor;
collecting a fourth measurement using the second sensor affixed to the motor;
aligning the third measurement and the fourth measurement in time and order at the edge intelligence device using the local computing hardware and software,
wherein the aligning is based on a second time stamp added to the third measurement and the fourth measurement by the real time clock.

12. A system for monitoring and reporting conditions of motors and transformers comprising:
at least one a first sensor and a second sensor affixed to one of a monitored motor or a monitored transformer;
an edge intelligence device with local computing hardware and software,
wherein the edge intelligence device is connected to the first sensor and the second sensor, and
wherein the edge intelligence device is local to the motor;
a data gateway with data gateway hardware and software;
a cloud based analytics system communicatively coupled to the data gateway; and
a user interface processing system communicatively coupled to the cloud based analytics system;
wherein the edge intelligence device, using the first sensor and the second sensor, collects data of the at least one motor or transformer;
wherein the edge intelligence device determines a key performance indicator (KPI) vector that corresponds to a function of the combined first measurement and the second measurement at a unique time value provided by a real time clock;
wherein the KPI vector is then transmitted from the edge intelligence device to the cloud based analytics system for further processing and storage KPI vector; and
wherein
the stored KPI vector is available to a user through user interface processing via the user interface processing system.

13. The system of claim 12, wherein the KPI vector determined at the edge intelligence device is determined as <KPI>=(t, val1, val2),
wherein t is the unique time value,
wherein val1 is the first measurement, and
wherein val2 is the second measurement.

14. The system of claim 13, wherein the first sensor and the second sensor are members of a plurality of sensors, and wherein the <KPI> determined at the edge intelligence is <KPI>=(t, val1, val2, . . . , valn), wherein valn is a last measurement from a last one of the plurality of sensors.

15. The system of claim 13, wherein each of the plurality of sensors are affixed to the monitored motor or the monitored transformer.

16. The system of claim 13, wherein at least one of the plurality of sensors are affixed to a standard protection device connected to the monitored motor.

17. The device of claim 12, wherein the first sensor and the second sensor are connected to the edge intelligence device through sensor interfaces defined by hardware specifications and an IO API.

18. The device of claim 12, wherein at least one of a current transducer or a voltage transducer is interfaced to the edge intelligence device through analog signal conditioning circuits to provide an isolated and scaled analog signal to the edge intelligence device.

19. The device of claim 12, wherein the first sensor is one of a temperature sensor that measures a surface temperature of the motor or a vibration sensor that measures a vibration of the motor.

20. The system of claim 12, wherein the KPI vector is a first KPI vector, wherein the time stamp is a first time stamp, and wherein after the first KPI vector has been determined, the system:
collects a third measurement using the first sensor affixed to the motor;
collects a fourth measurement using the second sensor affixed to the motor;
aligns the third measurement and the fourth measurement in time and order at the edge intelligence device using the local computing hardware and software,
wherein the aligning is based on a second time stamp added to the third measurement and the fourth measurement by the real time clock.

* * * * *